(12) United States Patent
Oliaei et al.

(10) Patent No.: US 10,340,891 B1
(45) Date of Patent: Jul. 2, 2019

(54) DIFFERENTIAL ELLIPTIC FILTER WITH A SINGLE OP-AMP

(71) Applicant: Quantenna Communications, Inc., San Jose, CA (US)

(72) Inventors: Omid Oliaei, Saratoga, CA (US); Didier Margairaz, San Jose, CA (US)

(73) Assignee: QUANTENNA COMMUNICATIONS, INC., San Jose, CA (US)

( * ) Notice: Subject to any disclaimer, the term of this patent is extended or adjusted under 35 U.S.C. 154(b) by 0 days.

(21) Appl. No.: 15/847,151

(22) Filed: Dec. 19, 2017

(51) Int. Cl.
 *H03H 11/12* (2006.01)
(52) U.S. Cl.
 CPC .............................. *H03H 11/1269* (2013.01)
(58) Field of Classification Search
 CPC ................................................ H03H 11/1269
 USPC ........................................................ 327/558
 See application file for complete search history.

(56) References Cited

U.S. PATENT DOCUMENTS

| | | | | |
|---|---|---|---|---|
| 5,049,831 A * | 9/1991 | Westwick | .......... | H03H 11/1217 330/107 |
| 5,455,582 A * | 10/1995 | Valdenaire | ............ | H03M 1/785 341/144 |
| 6,344,773 B1 * | 2/2002 | Sevastopoulos | ... | H03H 11/1291 327/552 |
| 6,369,645 B1 * | 4/2002 | Takahashi | ............ | H03H 11/126 327/552 |
| 6,583,662 B1 * | 6/2003 | Lim | ..................... | H03H 11/126 327/553 |
| 6,816,004 B2 * | 11/2004 | Easwaran | .......... | H03H 11/1217 327/552 |
| 7,026,856 B2 * | 4/2006 | D'Amico | ........... | H03H 11/0422 327/352 |
| 7,737,772 B2 * | 6/2010 | Lee | .................... | H03H 11/1291 327/552 |
| 8,797,097 B2 * | 8/2014 | Chiu | .................... | H03H 11/126 327/552 |

* cited by examiner

*Primary Examiner* — Ryan Jager
(74) *Attorney, Agent, or Firm* — Michael J. Scapin

(57) ABSTRACT

A differential elliptic filter circuit includes: a differential amplifier, feedback and feedforward paths. An upper pair and a lower pair of inverting feedback paths couple a corresponding one the differential signal outputs of the amplifier to an inverting one of a pair of inputs of the amplifier, to provide two complex conjugate poles, and establish upper and lower virtual grounds at the amplifier inputs. Upper and lower inverting feedforward paths couple corresponding passive nodes of the upper and lower pairs of inverting feedback paths to respectively the lower and upper virtual grounds to provide two zeros of the circuit. The upper and lower non-inverting feedforward paths couple an upper and lower one of a pair of differential signal inputs of the circuit to respectively the upper and lower virtual grounds to enable positioning of the two zeros of the circuit on an imaginary axis of a pole-zero plot.

6 Claims, 2 Drawing Sheets

Single Op Amp Differential Elliptic Filter has Narrow Transition Region

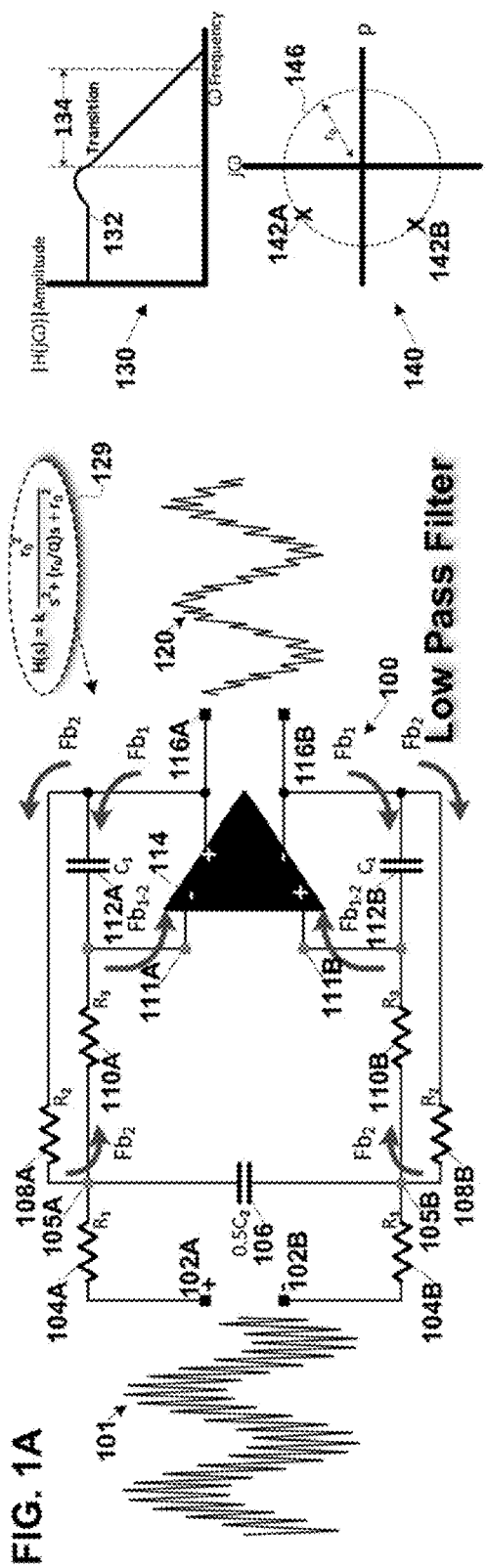
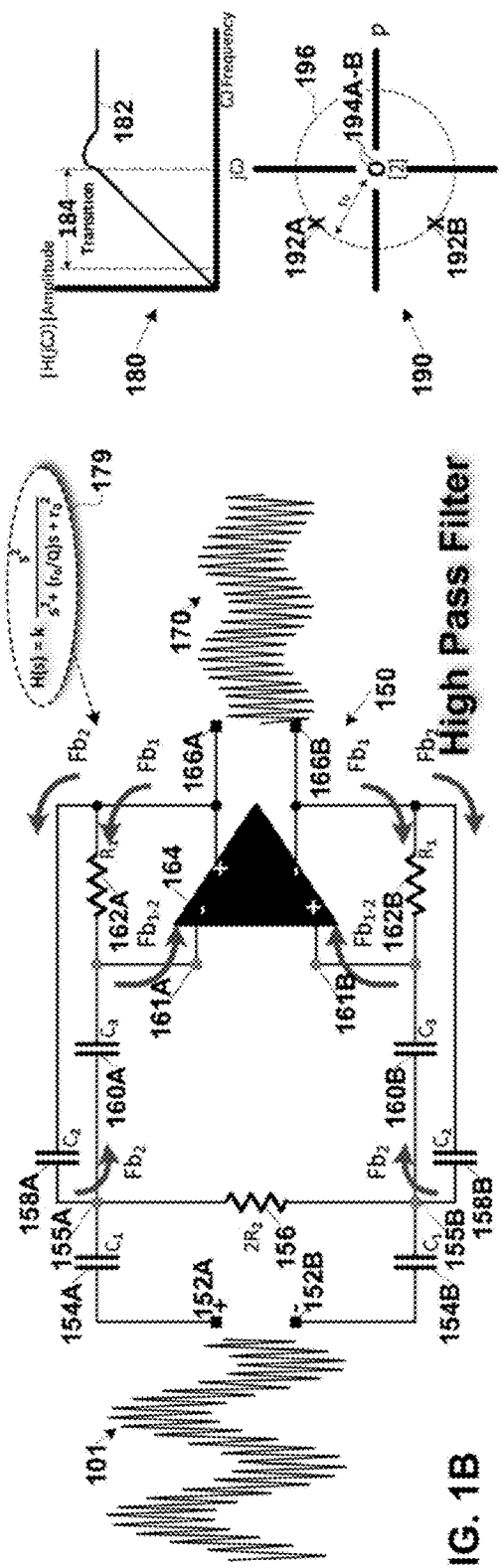
FIG. 1A
FIG. 1B
PRIOR ART: Single Op Amp Differential Filters have Broad Transition Regions

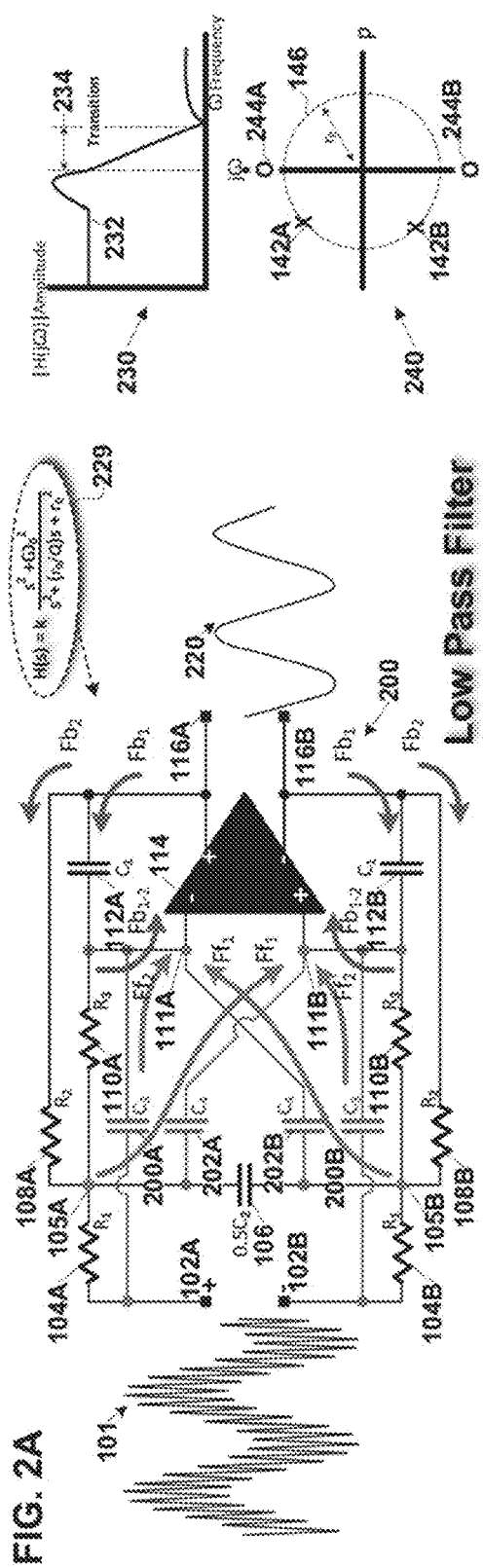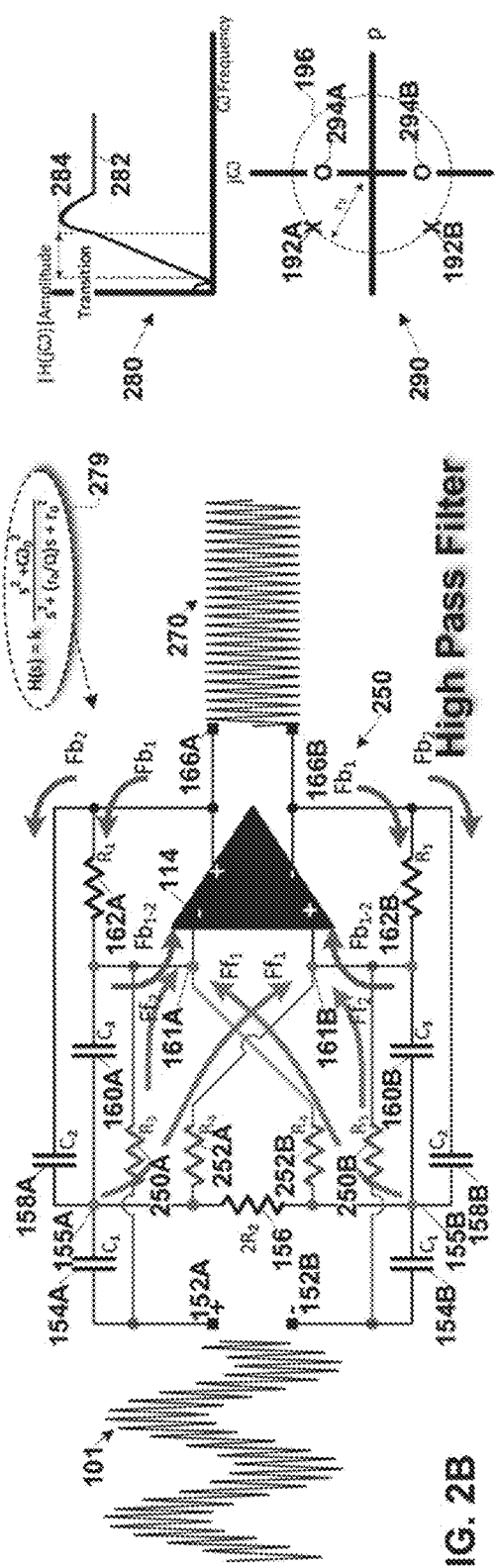

US 10,340,891 B1

DIFFERENTIAL ELLIPTIC FILTER WITH A SINGLE OP-AMP

BACKGROUND OF THE INVENTION

1. Field of Invention

The field of the present invention relates in general to analog signal filters and in particular to differential elliptic filters.

2. Description of the Related Art

Analog filters have a wide range of applications including: audio and RF signal processing. One figure of merit for analog filters is the sharpness transition between the pass band and stop band frequencies. Ideally a filter would operate as a brick wall, but practically such is not the case. The number of components associated with an analog filter is a function of the filter type, e.g. Bessel, Butterworth, Chebyshev and Elliptic, as well as the order of the filter. The order of a filter determines the steepness of the roll-off which may be increased by serially cascading filters to one another. Typically analog filters of lower order will have broader transition regions, and analog filters which have a higher order will be able to narrow the transition region between stop band and pass band frequencies but at the cost of more components and complexity. There are four classis analog filter types: Bessel, Butterworth, Chebyshev and Elliptic. Ranked in terms of the width of the transition zone, a.k.a. roll-off rate, the Bessel filters have the broadest transition zones, i.e. the lowest roll-off rate, and Elliptic filters have the narrowest transition zones, i.e. the highest/steepest roll-off rate. Ranked in terms of the typical number of components Bessel filters tend to have the fewer components than Elliptic.

SUMMARY OF THE INVENTION

The invention provides a differential elliptic filter implemented with a single op-amp. In an embodiment of the invention the differential elliptic filter circuit includes: a pair of differential signal inputs; a differential amplifier including a pair of inputs and differential signal outputs; an upper pair and lower pair of inverting feedback paths, and upper and lower inverting and non-inverting feedforward paths. The upper pair and a lower pair of inverting feedback paths are coupled between a corresponding one the differential signal outputs and an inverting one of the pair of inputs of the differential amplifier, and are configured to provide two complex conjugate poles of the elliptic filter circuit, and to establish upper and lower virtual grounds at the inputs of the differential amplifier. The upper inverting feedforward path couples a passive node of the upper pair of inverting feedback paths to the lower one of the virtual grounds, and the lower inverting feedforward path couples a passive node of the lower pair of inverting feedback paths to the upper one of the virtual grounds. The upper and lower inverting feedforward paths are configured to provide two zeros of the elliptic filter circuit. The upper non-inverting feedforward path couples an upper one of the pair of differential signal inputs to the upper one of the virtual grounds, and the lower non-inverting feedforward path couples a lower one of the pair of differential signal inputs to the lower one of the virtual grounds, to enable positioning of the two zeros of the filter circuit on an imaginary axis of a pole-zero plot of the elliptic filter circuit. Corresponding differential biquadratic filter circuits are also Claimed.

BRIEF DESCRIPTION OF THE DRAWINGS

These and other features and advantages of the present invention will become more apparent to those skilled in the art from the following detailed description in conjunction with the appended drawings in which:

FIGS. 1A-B are detailed circuit diagrams of prior art Butterworth or Chebyshev single op-amp configurations of differential low and high pass filter circuits respectively; and FIG. 2A-B are detailed circuit diagram of embodiments of the invention in which inverting feedforward paths and non-inverting feedforward paths are configured to convert the prior art filters to Elliptic low pass and Elliptic high pass filter circuits utilizing the single op-amp.

DETAILED DESCRIPTION OF THE EMBODIMENTS

FIGS. 1A-B are detailed circuit diagrams of prior art Bessel, Butterworth or Chebyshev single op-amp configurations of differential low and high pass filter circuits respectively. FIG. 1A shows the prior art differential low pass filter circuit 100, a graph 130 of the circuit's frequency response, and a pole-zero plot 140 of the low pass filter circuit's transfer function 129. FIG. 1B shows the prior art differential high pass filter circuit 150, a graph 180 of the circuit's frequency response, and a pole-zero plot 190 of the high pass filter circuit's transfer function 179. The low pass and high pass circuits are each realized with a single differential op-amp which has an upper pair and a lower pair of inverting feedback paths between a corresponding one the differential signal outputs of the differential amplifier and an inverting one of the pair of inputs of the differential amplifier. These inverting feedback paths are configured to provide two complex conjugate poles of the Prior Art Bessel, Butterworth or Chebyshev low and high pass filter circuits, and to establish upper and lower virtual grounds at the inputs of each differential amplifier.

FIG. 1A is a detailed circuit diagram of a prior art Bessel, Butterworth or Chebyshev differential low pass filter circuit with a differential op-amp with upper and lower pairs of inverting feedback paths configured to provide the poles of a differential low pass filter. At the differential inputs 102A-B of the circuit, a pair of resistors 104A-B (a.k.a. "$R_1$") transform an analog input signal 101 into a current flowing into passive nodes 105A-B on respectively the upper and lower half of the circuit. The current on the upper passive node 105A and the current on the lower passive node 105B generates a corresponding voltage which varies inversely with the frequency of the input signal 101, i.e. the voltage on the passive nodes decreases as the frequency of the input signal increases. A capacitor 106 (a.k.a. "$0.5C_2$") couples the upper and lower passive nodes 105A-B respectively to one another.

The upper and lower pair of inverting feedback paths (a.k.a. $Fb_{1-2}$) each comprise a capacitor $C_1$ coupled in parallel with series coupled resistors $R_2$-$R_3$ between the corresponding one of the differential amplifier's outputs 116A-B and the corresponding one of the inverting inputs 111A-B of the differential amplifier 114, to provide complex conjugate poles 142A-B of the low pass filter circuit 100; and to establish upper and lower virtual grounds at the inputs 111A-B of the differential amplifier. Specifically, the $1^{st}$ of the upper pair of inverting feedback paths (a.k.a. "$Fb_1$")

couples the upper differential output of the circuit and amplifier 116A to the inverting input 111A of the amplifier via capacitor 112A (a.k.a. "$C_1$"). The $2^{nd}$ of the upper pair of inverting feedback paths (a.k.a. "$Fb_2$") couples the upper differential output of the circuit and amplifier 116A to the inverting input 111A of the amplifier via series coupled resistors 108A (a.k.a. "$R_2$") and 110A (a.k.a. "$R_3$"). The upper pair of inverting feedback paths $Fb_{1-2}$ establish the upper virtual ground at amplifier input 111A. The $1^{st}$ of the lower pair of inverting feedback paths (a.k.a. "$Fb_1$") couples the lower differential output of the circuit and amplifier 116B to the inverting input 111B of the amplifier via capacitor 112B (a.k.a. "$C_1$"). The $2^{nd}$ of the lower pair of inverting feedback paths (a.k.a. "$Fb_2$") couples the lower differential output of the circuit and amplifier 116B to the inverting input 111B of the amplifier via series coupled resistors 108B (a.k.a. "$R_2$") and 110B (a.k.a. "$R_3$"). The upper pair of inverting feedback paths $Fb_{1-2}$ establish the lower virtual ground at amplifier input 111B.

The analog signal 120 at the output of this prior art differential low pass filter circuit 100 exhibits a limited decrease in the high frequency component of the input signal. Graph 130 shows the Prior Art differential low pass filter circuit's frequency response 132, with frequency on the horizontal axis and amplitude on the vertical axis. The circuit exhibits a broad transition region 134 between the lower frequencies which are passed, and the higher frequencies which are blocked. A low pass filter circuit with such a broad transition region is described as having a gradual roll-off.

The pole plot 140 of the Prior Art differential low pass filter circuit is derived from the specific nodal equations for the circuit expressed within the general transfer function 129 for the circuit as shown in the following Eq. 1.

$$H(s) = K \frac{r_0^2}{s^2 + (r_0/Q)s + r_0^2} \quad \text{Equation 1}$$

where $r_0$ is called natural frequency, Q is quality factor, and the complex-domain frequency s is related to the real-domain frequency $\omega$ by the equation $s=j\omega$ where $j=\sqrt{-1}$. The three possible mathematical filter approximations implemented with such a filter transfer function are Bessel, Butterworth and Chebyshev. Bessel and Butterworth filter response exhibit a monotonically decreasing magnitude response. Chebyshev filter response exhibits ripples in the passband or stopband frequencies. The pole plot has a horizontal real axis and a vertical imaginary axis on the "S" plane. The pole plot 140 shows two complex conjugate poles 142A-B on the left side of the imaginary axis, in the $2^{nd}$ and $3^{rd}$ quadrants respectively. These poles are located on a circle 146 centered on the origin with a radius $r_0$ corresponding to the natural frequency of the circuit. These complex conjugate poles are provided by the upper and lower pair of inverting feedback paths $Fb_{1-2}$.

FIG. 1B is a detailed circuit diagram of a prior art Bessel, Butterworth or Chebyshev differential high pass filter circuit with a differential op-amp with upper and lower pairs of inverting feedback paths configured to provide the poles of a differential high pass filter. At the differential inputs 152A-B of the circuit, a pair of capacitors 154A-B (a.k.a. "$C_1$") transform the analog input signal 101 into a current flowing into passive nodes 155A-B on respectively the upper and lower half of the circuit. The current on the upper passive node 155A and the current on the lower passive node 155B generates a corresponding voltage which varies directly with the frequency of the input signal 101, i.e. the voltage on the passive nodes increases as the frequency of the input signal increases. A resistor 156 (a.k.a. "$2R_2$") couples the upper and lower passive nodes 155A-B respectively to one another.

The upper and lower pair of inverting feedback paths (a.k.a. $Fb_{1-2}$) each comprise a resistor $R_1$ coupled in parallel with series coupled capacitors $C_2$-$C_3$ between the corresponding one of the differential amplifier's outputs 166A-B and the corresponding one of the inverting inputs 161A-B of the differential amplifier 164, to provide complex conjugate poles 192A-B of the high pass filter circuit 150 and a pair of zeros 194A-B at the origin of the pole-zero plot 190; and to establish upper and lower virtual grounds at the inputs 161A-B of the differential amplifier. Specifically, the $1^{st}$ of the upper pair of inverting feedback paths (a.k.a. "$Fb_1$") couples the upper differential output of the circuit and amplifier 166A to the inverting input 161A of the amplifier via resistor 162A (a.k.a. "$R_1$"). The $2^{nd}$ of the upper pair of inverting feedback paths (a.k.a. "$Fb_2$") couples the upper differential output of the circuit and amplifier 116A to the inverting input 161A of the amplifier via series coupled capacitors 158A (a.k.a. "$C_2$") and 160A (a.k.a. "$C_3$"). The upper pair of inverting feedback paths $Fb_{1-2}$ establish the upper virtual ground at amplifier input 161A. The $1^{st}$ of the lower pair of inverting feedback paths (a.k.a. "$Fb_1$") couples the lower differential output of the circuit and amplifier 166B to the inverting input 161B of the amplifier via resistor 116B (a.k.a. "$R_1$"). The $2^{nd}$ of the lower pair of inverting feedback paths (a.k.a. "$Fb_2$") couples the lower differential output of the circuit and amplifier 166B to the inverting input 161B of the amplifier via series coupled capacitors 158B (a.k.a. "$C_2$") and 160B (a.k.a. "$C_3$"). The lower pair of inverting feedback paths $Fb_{1-2}$ establish the lower virtual ground at amplifier input 161B.

The analog signal 170 at the output of this prior art differential high pass filter circuit 150 exhibits a limited decrease in the low frequency component of the input signal. Graph 180 shows the Prior Art differential high pass filter circuit's frequency response 182, with frequency on the horizontal axis and amplitude on the vertical axis. The circuit exhibits a broad transition region 184 between the lower frequencies which are blocked, and the higher frequencies which are passed. A high pass filter circuit with such a broad transition region is described as having a gradual roll-up.

The pole plot 190 of the Prior Art differential high pass filter circuit is derived from the specific nodal equations for the circuit expressed within the general transfer function 179 for the circuit as shown in the following Eq. 2.

$$H(s) = K \frac{s^2}{s^2 + (r_0/Q)s + r_0^2} \quad \text{Equation 2}$$

where $r_0$ is the natural frequency, Q is the quality factor, and the complex-domain frequency s is related to the real-domain frequency $\omega$ by the equation $s=j\omega$ where $j=\sqrt{-1}$. The three possible mathematical filter approximations implemented with such a filter transfer function are Bessel, Butterworth and Chebyshev. Bessel and Butterworth filter response exhibits a monotonically decreasing magnitude response. Chebyshev filter response exhibits ripples in the passband or stopband frequencies. The pole plot has a horizontal real axis and a vertical imaginary axis on the "S"

plane. The pole plot 190 shows two complex conjugate poles 192A-B on the left side of the imaginary axis, in the $2^{nd}$ and $3^{rd}$ quadrants respectively. These poles are located on a circle 196 centered on the origin with a radius $r_0$ corresponding to the natural frequency of the circuit. These complex conjugate poles as well as the pair of zeros 194A-B centered at the origin are provided by the upper and lower pair of inverting feedback paths $Fb_{1-2}$.

FIG. 2A-B are detailed circuit diagram of embodiments of the invention in which inverting feedforward paths and non-inverting feedforward paths are configured to convert the prior art Butterworth or Chebyshev filters shown in FIGS. 1A-B to differential elliptic low and high pass filter circuits utilizing a single differential op-amp. FIG. 2A shows the differential elliptic low pass filter circuit 200, a graph 230 of the circuit's frequency response, and a pole-zero plot 240 of the differential elliptic low pass filter circuit's transfer function 229. FIG. 2B shows the differential elliptic high pass filter circuit 250, a graph 280 of the circuit's frequency response, and a pole-zero plot 290 of the differential elliptic high pass filter circuit's transfer function 279. The differential elliptic low pass and high pass circuits are each realized with a single differential op-amp which has the upper pair and a lower pair of inverting feedback paths $Fb_{1-2}$ between a corresponding one the differential signal outputs of the differential amplifier and an inverting one of the pair of inputs of the differential amplifier. These inverting feedback paths are configured to provide two complex conjugate poles of the differential elliptic low and high pass filter circuits, and to establish upper and lower virtual grounds at the inputs of each differential amplifier. The differential elliptic low and high pass filter circuits shown in respectively FIG. 2A and FIG. 2B also include both inverting and non-inverting feedforward paths which collectively provide two zeros 244A-B, 294A-B on the imaginary axis of the respective pole-zero plot 240 and 290 of each filter. The inverting feedforward paths $Ff_1$ include an upper and lower path. The upper inverting feedforward path couples a passive node of the upper pair of inverting feedback paths to the lower one of the virtual grounds, and the lower inverting feedforward path couples a passive node of the lower pair of inverting feedback paths to the upper one of the virtual grounds. The upper and lower inverting feedforward paths $Ff_1$ are configured to provide two zeros of the differential elliptic filter circuit. The non-inverting feedforward paths $Ff_2$ include an upper and lower path. The upper non-inverting feedforward path couples an upper one of the pair of differential signal inputs to the upper one of the virtual grounds, and the lower non-inverting feedforward path couples a lower one of the pair of differential signal inputs to the lower one of the virtual grounds, to enable positioning of the two zeros of the filter circuit on an imaginary axis of a pole-zero plot of the elliptic filter circuit.

FIG. 2A is a detailed circuit diagram of the differential elliptic low pass filter circuit 200 of an embodiment of the current invention. The circuit includes the differential op-amp 114 with the upper and lower pairs of inverting feedback paths $Fb_{1-2}$ configured to provide the complex conjugate poles 142A-B of the differential elliptic low pass filter. At the differential inputs 102A-B of the circuit, the pair of resistors 104A-B (a.k.a. "$R_1$") transform the analog input signal 101 into a current flowing into passive nodes 105A-B on respectively the upper and lower half of the circuit. The current on the upper passive node 105A and the current on the lower passive node 105B generates a corresponding voltage which varies inversely with the frequency of the input signal 101, i.e. the voltage on the passive nodes decreases as the frequency of the input signal increases. The capacitor 106 (a.k.a. "$0.5C_2$") couples the upper and lower passive nodes 105A-B respectively to one another. The upper and lower pair of inverting feedback paths (a.k.a. $Fb_{1-2}$) each comprise a capacitor $C_1$ coupled in parallel with series coupled resistors $R_2$-$R_3$ between the corresponding one of the differential amplifier's outputs 116A-B and the corresponding one of the inverting inputs 111A-B of the differential amplifier 114, to provide complex conjugate poles 142A-B of the low pass filter circuit 100; and to establish upper and lower virtual grounds at the inputs 111A-B of the differential amplifier.

The upper and a lower inverting feedforward paths $Ff_1$ each include a capacitor $C_4$ coupling a corresponding one of the passive nodes 105A-B to a corresponding one of the virtual grounds at the inputs 111A-B of the differential amplifier 114. These inverting feedforward paths $Ff_1$ provide the complex conjugate zeros of the low pass elliptic filter circuit. Specifically, the upper inverting feedforward path is provided by a capacitor 202A (a.k.a. "$C_4$") coupled between the upper passive node 105A and the lower virtual ground at the inverting input 111B of the differential amplifier. The lower inverting feedforward path is provided by capacitor 202B (a.k.a. "$C_4$") coupled between the lower passive node 105B and the upper virtual ground at the inverting input 111A of the differential amplifier.

The upper and a lower non-inverting feedforward paths $Ff_2$ each include a capacitor $C_3$ coupling a corresponding one of the passive nodes 105A-B to a corresponding one of the virtual grounds at the inputs 111A-B of the differential amplifier 114. These non-inverting feedforward paths $Ff_2$ allow the positioning of the complex conjugate zeros 244A-B on an imaginary axis of the pole-zero plot 240 of the differential elliptic low pass filter circuit. Specifically, the upper non-inverting feedforward path is provided by a capacitor 200A (a.k.a. "$C_3$") coupled between the upper input 102A of the filter circuit and the upper virtual ground at the non-inverting input 111A of the differential amplifier. The lower non-inverting feedforward path is provided by capacitor 200B (a.k.a. "$C_3$") coupled between the lower input 102B of the filter circuit and the lower virtual ground at the non-inverting input 111B of the differential amplifier.

The analog signal 220 at the output of the differential elliptic low pass filter circuit 200 exhibits a substantial decrease in the high frequency component of the input signal when compared to the prior art low pass filter shown in FIG. 1A. Graph 230 shows the differential elliptic low pass filter circuit's frequency response 232, with frequency on the horizontal axis and amplitude on the vertical axis. The circuit exhibits a narrow transition region 234 between the lower frequencies which are passed, and the higher frequencies which are blocked. A low pass filter circuit with such a narrow transition region is described as having a steep roll-off.

The pole-zero plot 240 of the differential elliptic low pass filter circuit is derived from the specific nodal equations for the circuit expressed within the general transfer function 229 for the circuit as shown in the following Eq. 3.

$$H(s) = K \frac{s^2 + \omega_0^2}{s^2 + (r_0/Q)s + r_0^2} \quad \text{Equation 3}$$

where $r_0$ is called natural frequency, Q is quality factor, and the complex-domain frequency s is related to the real-domain frequency $\omega$ by the equation $s=j\omega$ where $j=\sqrt{-1}$. The mathematical filter approximation implemented with such a filter transfer function is identified as Elliptic. The pole-zero plot has a horizontal real axis and a vertical imaginary axis on the "S" plane. The pole-zero plot 240 shows two complex conjugate poles 142A-B on the left side of the imaginary axis, in the $2^{nd}$ and $3^{rd}$ quadrants respectively. These poles are located on a circle 146 centered on the origin with a radius $r_0$ corresponding to the natural frequency of the circuit. These complex conjugate poles are provided by the upper and lower pair of inverting feedback paths $Fb_{1-2}$. The pole-zero plot 240 also shows two complex conjugate zeros 244A-B positioned on the imaginary axis at a radius greater than $r_0$. These complex conjugate zeros are provided by the combined inverting and non-inverting feedforward paths $Ff_1$ and $Ff_2$.

FIG. 2B is a detailed circuit diagram of the differential elliptic high pass filter circuit 250 of an embodiment of the current invention. The circuit includes the differential op-amp 114 with the upper and lower pairs of inverting feedback paths $Fb_{1-2}$ configured to provide the complex conjugate poles 192A-B of the differential elliptic low pass filter. At the differential inputs 152A-B of the circuit, the pair of capacitors 154A-B (a.k.a. "$C_1$") transform the analog input signal 101 into a current flowing into passive nodes 155A-B on respectively the upper and lower half of the circuit. The current on the upper passive node 155A and the current on the lower passive node 155B generates a corresponding voltage which varies directly with the frequency of the input signal 101, i.e. the voltage on the passive nodes increases as the frequency of the input signal increases. The resistor 156 (a.k.a. "$2R_2$") couples the upper and lower passive nodes 155A-B respectively to one another. The upper and lower pair of inverting feedback paths (a.k.a. $Fb_{1-2}$) each comprise a resistor $R_1$ coupled in parallel with series coupled resistors $C_2$-$C_3$ between the corresponding one of the differential amplifier's outputs 166A-B and the corresponding one of the inverting inputs 161A-B of the differential amplifier 114, to provide complex conjugate poles 192A-B of the high pass filter circuit 250; and to establish upper and lower virtual grounds at the inputs 161A-B of the differential amplifier.

The upper and a lower inverting feedforward paths $Ff_1$ each include a resistor $R_4$ coupling a corresponding one of the passive nodes 155A-B to a corresponding one of the virtual grounds at the inputs 161A-B of the differential amplifier 114. These inverting feedforward paths $Ff_1$ provide the complex conjugate zeros of the high pass elliptic filter circuit. Specifically, the upper inverting feedforward path is provided by a resistor 252A (a.k.a. "$R_4$") coupled between the upper passive node 155A and the lower virtual ground at the inverting input 161B of the differential amplifier. The lower inverting feedforward path is provided by resistor 252B (a.k.a. "$R_4$") coupled between the lower passive node 155B and the upper virtual ground at the inverting input 116A of the differential amplifier.

The upper and a lower non-inverting feedforward paths $Ff_2$ each include a resistor $R_3$ coupling a corresponding one of the passive nodes 155A-B to a corresponding one of the virtual grounds at the inputs 161A-B of the differential amplifier 114. These non-inverting feedforward paths $Ff_2$ allow the positioning of the complex conjugate zeros 294A-B on an imaginary axis of the pole-zero plot 290 of the differential elliptic high pass filter circuit. Specifically, the upper non-inverting feedforward path is provided by a resistor 250A (a.k.a. "$R_3$") coupled between the upper input 152A of the filter circuit and the upper virtual ground at the non-inverting input 161A of the differential amplifier. The lower non-inverting feedforward path is provided by resistor 250B (a.k.a. "$R_3$") coupled between the lower input 152B of the filter circuit and the lower virtual ground at the non-inverting input 161B of the differential amplifier.

The analog signal 270 at the output of the differential elliptic high pass filter circuit 250 exhibits a substantial decrease in the low frequency component of the input signal when compared to the prior art high pass filter shown in FIG. 1B. Graph 280 shows the differential elliptic high pass filter circuit's frequency response 282, with frequency on the horizontal axis and amplitude on the vertical axis. The circuit exhibits a narrow transition region 284 between the lower frequencies which are blocked, and the higher frequencies which are passed. A high pass filter circuit with such a narrow transition region is described as having a steep roll-off.

The pole-zero plot 290 of the differential elliptic high pass filter circuit is derived from the specific nodal equations for the circuit expressed within the general transfer function 279 for elliptic circuits as set forth above in Eq. 3. The mathematical filter approximation implemented with such a filter transfer function is identified as Elliptic. The pole-zero plot has a horizontal real axis and a vertical imaginary axis on the "S" plane. The pole-zero plot 290 shows two complex conjugate poles 192A-B on the left side of the imaginary axis, in the $2^{nd}$ and $3^{rd}$ quadrants respectively. These poles are located on a circle 196 centered on the origin with a radius $r_0$ corresponding to the natural frequency of the circuit. These complex conjugate poles are provided by the upper and lower pair of inverting feedback paths $Fb_{1-2}$. The pole-zero plot 290 also shows two complex conjugate zeros 294A-B positioned on the imaginary axis at a radius less than $r_0$. These complex conjugate zeros are provided by the combined inverting and non-inverting feedforward paths $Ff_1$ and $Ff_2$.

In another embodiment of the invention biquadratic high and low pass filters are disclosed. In a $1^{st}$ biquadratic low pass filter embodiment of the invention the inverting feedforward paths $Ff_1$ of the elliptic low pass filter shown in FIG. 2A are removed, i.e. capacitors 202A-B (a.k.a. "$C_4$"), while retaining all other remaining components and paths. In a $2^{nd}$ biquadratic low pass filter embodiment of the invention the non-inverting feedforward paths $Ff_2$ of the elliptic low pass filter shown in FIG. 2A are removed, i.e. capacitors 200A-B (a.k.a. "$C_3$"), while retaining all other remaining components and paths. In a $1^{st}$ biquadratic high pass filter embodiment of the invention the inverting feedforward paths $Ff_1$ of the elliptic high pass filter shown in FIG. 2B are removed, i.e. resistors 252A-B (a.k.a. "$R_4$"), while retaining all other remaining components and paths. In a $2^{nd}$ biquadratic high pass filter embodiment of the invention the non-inverting feedforward paths $Ff_2$ of the elliptic high pass filter shown in FIG. 2A are removed, i.e. resistors 250A-B (a.k.a. "$R_3$"), while retaining all other remaining components and paths.

Derivations:

Elliptic filter approximation requires a transfer function as set forth above in Equation 3. The above transfer function has a numerator that depends on variable s. The zeros of this transfer function are located at $s=+j\omega_0$ and $s=-j\omega_0$, meaning that they are purely imaginary and located on the imaginary axis $j\omega$. The prior-art filters in FIGS. 1A-B are unable to realize such a transfer function. The reason is that implementing such a transfer function requires multiple feedforward paths in the filter structure that lead to the cancelling of the input signal at a certain frequency. This effect is described by a transmission zero in the transfer function.

Elliptic Lowpass Filter:

The embodiment of the differential elliptic low pass filter circuit shown in FIG. 2A provides for a filter structure that incorporates two pairs of non-inverting and inverting feedforward paths. The upper and lower non-inverting feedforward paths $Ff_2$ and the upper and lower inverting feedforward paths $Ff_1$ make it possible to realize a transfer function of the form described in Equation 3. As such, the lowpass filter in FIG. 2A can realize a fully-differential elliptic filter. However, specific conditions described later in this document need to be satisfied.

$$H(s) = \frac{V_o(s)}{V_{in}(s)} \qquad \text{Equation 4}$$

To derive the transfer function of this filter, which represents the ratio between the output voltage $V_o(s)$ and the input voltage $V_{in}(s)$ in the frequency domain as shown in Equation 4, we need to solve the nodal equations describing the Kirchhoff's Current Law (KCL) at the passive node 105A/105B and virtual ground 111A/111B as shown in the following Equation 5:

$$\begin{cases} G_1(V_1 - V_{in}) + G_3(V_1 - 0) + G_2(V_1 - V_o) + sC_2(V_1) + sC_4(V_1 - 0) \\ G_3(0 - V_1) + sC_3(0 - V_{in}) + sC_1(0 - V_o) + sC_4(0 + V_1) = 0 \end{cases} \qquad \text{Equation 5}$$

where we have defined conductance values $G_1=1/R_1$, $G_2=1/R_2$, and $G_3=1/R_3$ to simplify the notation and $V_1$ represents the voltage across capacitor 106 shown in FIG. 2A.

Solving this set of equations to obtain the ratio between the output voltage $V_o(s)$ and the input voltage $V_{in}(s)$ leads to the transfer function show in the following Equation 6:

$$H(s) = \frac{(-C_2C_3 - C_4C_3)s^2 + (C_4G_1 - C_3G_2 - C_3G_1 - C_3G_3)s - G_1G_3}{(C_1C_2 + C_1C_4)s^2 + (C_1G_1 + C_1G_2 + C_1G_3 - C_4G_2)s + G_2G_3} \qquad \text{Equation 6}$$

This transfer function shown in Equation 6 includes $s^2$, $s$, and constant terms in the numerator. To implement an elliptic filter, the first-order term s needs to be forced to zero.

Therefore, the following equality shown in the following Equation 7 needs to be satisfied:

$$C_4G_1 - C_3G_2 - C_3G_1 - C_3G_3 = 0 \qquad \text{Equation 7}$$

Equation 7 includes a positive term $C_4G_1$ which can cancel out the sum of the negative terms. This key characteristic, meaning the presence of a term with opposite sign, is established by the cross-coupled capacitors 202A-B (a.k.a. "$C_4$"). Further analysis shows that the above equation can be satisfied by two different values of $C_4$, with each value leading to a different set of component values realizing the desired transfer function.

Once the above condition is satisfied; the circuit transfer function reduces to the same form as of one of an elliptic filter as shown in the following Equation 8:

$$H(s) = \frac{(-C_2C_3 - C_4C_3)s^2 - G_1G_3}{(C_1C_2 + C_1C_4)s^2 + (C_1G_1 + C_1G_2 + C_1G_3 - C_4G_2)s + G_2G_3} \qquad \text{Equation 8}$$

The relationship between the above transfer function and the standard transfer function can be established using the following Equations 9-11:

$$K\frac{\omega_0^2}{r_0^2} = \frac{G_1}{G_2} \qquad \text{Equation 9}$$

$$r_0^2 = \frac{G_1G_3}{C_3(C_2 + C_4)} \qquad \text{Equation 10}$$

$$\frac{r_0}{Q} = \frac{C_1G_1 + C_1G_2 + C_1G_3 - C_4G_2}{C_1(C_2 + C_4)} \qquad \text{Equation 11}$$

The design methodology starts with a desired numerical transfer function and ends with obtaining the component values. One can note that the desired numerical transfer function includes four parameters: $K$, $\omega_0$, $r_0$, and $Q$. This indicates four conditions or equations to be satisfied. In addition, one needs to satisfy Equation 7. So, there are a total of five conditions to satisfy which are represented by five equations. On the other hand, the circuit includes seven components: $R_1$, $R_2$, $R_3$, $C_1$, $C_2$, $C_3$, $C_4$. This implies, seven variables and 5 equations. Therefore, once can arbitrarily select two of the components and calculate the remaining five components. As mentioned before, doing so leads to two set of acceptable values for the five components.

Elliptic High Pass Filter:

The embodiment of the differential elliptic high pass filter circuit shown in FIG. 2B provides for a filter structure that incorporates two pairs of non-inverting and inverting feedforward paths. The elliptic high pass transfer has a similar form to the lowpass transfer function as shown in Equation 3 above. Realizing a high pass elliptic filter also requires two inverting and non-inverting feedforward paths to cancel out the input signal at a specific frequency. The differential high pass filter circuit shown in FIG. 2B provides for a filter structure that incorporates two pairs of non-inverting and inverting feedforward paths. The non-inverting feedforward path created by resistors 250A-B (a.k.a. "$R_3$") and the inverting feedforward paths created by resistors 252A-B (a.k.a. "$R_4$") make it possible to realize a transfer function of the form described in Equation 3. Defining the conductance values $G_1=1/R_1$, $G_2=1/R_2$, the nodal equations of the circuit at the passive nodes 155A/155B and virtual grounds 161A/161B can be written in the matrix form as shown in the following Equation 12:

$$\begin{bmatrix} sC_1 + sC_2 + sC_3 + G_2 + G_4 & -sC_2 \\ -sC_3 + G_4 & -G_4 \end{bmatrix} \begin{bmatrix} V_1 \\ V_o \end{bmatrix} = \begin{bmatrix} sC_1 \\ G_3 \end{bmatrix} V_{in} \qquad \text{Equation 12}$$

where $V_1$ represents the voltage across resistor 156 (a.k.a. "$2R_2$"). Solving this set of equations, we obtain the transfer function shown in the following Equation 13:

$$H(s) = \frac{\begin{array}{c}(-C_1C_3)s^2 + \\ (G_4C_1 - G_3C_2 - G_3C_1 - G_3C_3)s - G_2G_3 - G_4G_3\end{array}}{\begin{array}{c}(C_2C_3)s^2 + \\ (G_1C_1 + G_1C_2 + G_1C_3 - G_4C_2)s + C_1C_2 + C_1C_4\end{array}} \quad \text{Equation 13}$$

To realize an elliptic filter, we need to force the first-order term in the numerator to zero as shown in the following Equation 14:

$$G_4C_1 - G_3C_2 - G_3C_1 - G_3C_3 = 0 \quad \text{Equation 14}$$

Once again, this condition can be satisfied if the first positive term cancels out the sum of the subsequent negative terms. This key mathematical property is established by the cross-couple resistor $R_4$. Once this condition is satisfied; the above transfer function takes up the form of an elliptic filter as shown in the following Equation 15:

$$H(s) = \frac{(-C_1C_3)s^2 - G_2G_3 - G_4G_3}{\begin{array}{c}(C_2C_3)s^2 + \\ (G_1C_1 + G_1C_2 + G_1C_3 - G_4C_2)s + C_1C_2 + C_1C_4\end{array}} \quad \text{Equation 15}$$

Design methodology involves starting from the target numerical transfer function with 4 variables and considering the requirement in Equation 14 which results in five equations and seven variables. Selecting two component values lets us calculate the remaining five component values. Solving the equations leads to two sets of valid values for the five remaining components.

Biquadratic Filters:

A biquadratic filter has the general form shown in the following Equation 16:

$$H(s) = \frac{b_2s^2 + b_1s + b_0}{a_2s^2 + a_1s + a_0} \quad \text{Equation 16}$$

The main difference between a general biquadratic filter and an elliptic filter is that the former includes complex conjugate zeros with non-zero real part while the latter only includes purely imaginary complex conjugate zeros. As a result, the magnitude response of an elliptic filter drops to zero at the notch frequency. On the other hand, the biquadratic filter has a non-zero magnitude response at the notch frequency. However, the amount of attenuation may be sufficient in certain applications to adopt a biquadratic filter rather than an elliptic filter for reasons such as better noise performance or smaller chip area.

Biquadratic Low Pass Filter:

A specific embodiment of interest for the biquadratic low pass filter is when $C_4=0$ and the transfer function takes the form shown in the following Equation 17:

$$H(s) = \frac{(-C_2C_3)s^2 + (-C_3G_2 - C_3G_1 - C_3G_3)s - G_1G_3}{(C_1C_2)s^2 + (C_1G_1 + C_1G_2 + C_1G_3)s + G_2G_3} \quad \text{Equation 17}$$

The above transfer function includes a quadratic numerator with complex conjugate zeros providing finite attenuation at the notch frequency.

In the second embodiment of the biquadratic low pass filter when $C_3=0$, the transfer function takes the form shown in the following Equation 18:

$$H(s) = \frac{(C_4G_1)s - G_1G_3}{\begin{array}{c}(C_1C_2 + C_1C_4)s^2 + \\ (C_1G_1 + C_1G_2 + C_1G_3 - C_4G_2)s + G_2G_3\end{array}} \quad \text{Equation 18}$$

The above transfer function includes simply a real zero.

Biquadratic High Pass Filter:

In a first embodiment of the biquadratic high pass filter, one specific case of interest is when $g_4=0$ or equivalently $R_4$ is not used. The resulting transfer function is shown in the following Equation 19:

$$H(s) = \frac{(-C_1C_3)s^2 + (-G_3C_2 - G_3C_1 - G_3C_3)s - G_2G_3}{\begin{array}{c}(C_2C_3)s^2 + (G_1C_1 + G_1C_2 + G_1C_3)s + \\ C_1C_2 + C_1C_4\end{array}} \quad \text{Equation 19}$$

The above transfer function includes a quadratic numerator with complex conjugate zeros providing finite attenuation at the notch frequency.

In the second embodiment of the high pass biquadratic filter when $g_3=0$, or equivalently $R_3$ is not used, the resulting transfer function is shown in Equation 20:

$$H(s) = \frac{(-C_1C_3)s^2 + (G_4C_1)s}{\begin{array}{c}(C_2C_3)s^2 + \\ (G_1C_1 + G_1C_2 + G_1C_3 - G_4C_2)s + C_1C_2 + C_1C_4\end{array}} \quad \text{Equation 20}$$

The above transfer function includes simply a real zero.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A differential elliptic filter circuit comprising:
a pair of differential signal inputs;
a differential amplifier including a pair of inputs and differential signal outputs;
an upper pair and a lower pair of inverting feedback paths between a corresponding one the differential signal outputs and an inverting one of the pair of inputs of the differential amplifier, configured to provide two complex conjugate poles of the elliptic filter circuit, and to establish upper and lower virtual grounds at the inputs of the differential amplifier, wherein the upper and lower pair of inverting feedback paths each comprise a capacitor coupled in parallel with series coupled resistors between the corresponding one of the differential amplifier's outputs and the corresponding one of the virtual grounds, to provide complex conjugate poles of a low pass elliptic filter circuit, and the inverting and non-inverting feedforward paths cross-coupled and configured to provide complex conjugate zeros of the low pass elliptic filter circuit;
an upper inverting feedforward path of the inverting feedforward path coupling a passive node of the upper pair of inverting feedback paths to the lower one of the virtual grounds, and a lower inverting feedforward path of the inverting feedforward path coupling a passive node of the lower pair of inverting feedback paths to the upper one of the virtual grounds, and the upper and lower inverting feedforward paths configured to provide two zeros of the elliptic filter circuit; and an upper non-inverting feedforward path coupling an upper one of the pair of differential signal inputs to the upper one of the virtual grounds, and a lower non-inverting feedforward path coupling a lower one of the pair of differential signal inputs to the lower one of the virtual grounds, to enable positioning of the two zeros of the filter circuit on an imaginary axis of a pole-zero plot of the elliptic filter circuit.

2. The differential elliptic filter circuit of claim 1, further comprising:

the upper and lower pairs of inverting feedback paths configured to provide complex conjugate poles of a low pass elliptic filter circuit; and the upper and a lower inverting feedforward paths each include a capacitor coupling a corresponding one of the passive nodes to a corresponding one of the virtual grounds, wherein the inverting and non-inverting feedforward paths provide complex conjugate zeros of the low pass elliptic filter circuit.

3. The differential elliptic filter circuit of claim 1, further comprising:

the upper and lower pairs of inverting feedback paths configured to provide complex conjugate poles of a high pass elliptic filter circuit; and the upper and a lower inverting feedforward paths each include a resistor coupling a corresponding one of the passive nodes to a corresponding one of the virtual grounds, wherein the inverting and non-inverting feedforward paths provide complex conjugate zeros of the high pass elliptic filter circuit.

4. The differential elliptic filter circuit of claim 1, further comprising:

the upper and lower pairs of inverting feedback paths configured to provide complex conjugate poles of a low pass elliptic filter circuit; and the upper and a lower non-inverting feedforward path including a capacitor coupled from a corresponding one of the pair of differential signal inputs to the corresponding one of the virtual grounds, wherein the inverting and non-inverting feedforward paths provide complex conjugate zeros of the low pass elliptic filter circuit.

5. The differential elliptic filter circuit of claim 1, further comprising:

the upper and lower pairs of inverting feedback paths configured to provide complex conjugate poles of a high pass elliptic filter circuit; and an upper and a lower non-inverting feedforward path including a resistor coupled from a corresponding one of the pair of differential signal inputs to the corresponding one of the virtual grounds, wherein the inverting and non-inverting feedforward paths provide complex conjugate zeros of the high pass elliptic filter circuit.

6. The differential elliptic filter circuit of claim 1, further comprising:

the upper and lower pair of inverting feedback paths each comprise a resistor coupled in parallel with series coupled capacitors between the corresponding one of the differential amplifier's outputs and the corresponding one of the virtual grounds, to provide complex conjugate poles of a high pass elliptic filter circuit; and the inverting and non-inverting feedforward paths configured to provide complex conjugate zeros of the high pass elliptic filter circuit.

* * * * *